(12) United States Patent
Cui

(10) Patent No.: US 11,011,553 B2
(45) Date of Patent: May 18, 2021

(54) TFT ARRAY SUBSTRATE AND DISPLAY DEVICE

(71) Applicant: Wuhan China Star Optoelectronics Technology Co., Ltd., Wuhan (CN)

(72) Inventor: Zhufeng Cui, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 296 days.

(21) Appl. No.: 16/319,351

(22) PCT Filed: Sep. 18, 2018

(86) PCT No.: PCT/CN2018/106330
§ 371 (c)(1),
(2) Date: Jan. 21, 2019

(87) PCT Pub. No.: WO2019/205467
PCT Pub. Date: Oct. 31, 2019

(65) Prior Publication Data
US 2021/0082962 A1    Mar. 18, 2021

(30) Foreign Application Priority Data

Apr. 27, 2018  (CN) .......................... 201810390106.5

(51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *G02F 1/13629* (2021.01)

(58) Field of Classification Search
None
See application file for complete search history.

(56) References Cited

U.S. PATENT DOCUMENTS

| 10,008,163 | B1 * | 6/2018 | Cui ...................... G09G 3/3688 |
| 2008/0049156 | A1 * | 2/2008 | Kim ...................... G09G 3/3648 |
| | | | 349/40 |

(Continued)

FOREIGN PATENT DOCUMENTS

| CN | 101202289 A | 6/2008 |
| CN | 106169456 A | 11/2016 |

OTHER PUBLICATIONS

Written Opinion of the International Searching Authority (translation), dated Jan. 29, 2019 in corresponding PCT application PCT/CN2018/106330, dated Jan. 2019.*

*Primary Examiner* — Ryan Crockett
(74) *Attorney, Agent, or Firm* — Leong C. Lei

(57) ABSTRACT

The present invention teaches a TFT array substrate and a display device. The TFT array substrate disposes second fanout lines of the fanout area on a first metallic layer, and disposes first fanout lines of the fanout area on a second metallic layer. Data lines and their corresponding second fanout lines, and second fanout lines and their corresponding first fanout lines, are connected together through vias. The first metallic layer has a greater surface resistivity than that of the second metallic layer. The present invention's fanout lines corresponding to a same data line have a significantly increased total impedance, and the impedance variation of the fanout lines has a less impact. As data signals propagate to the data lines through the fanout lines, the data signals' arrival times to the data lines have little difference, thereby enhancing the display quality, more reliable manufacturing process, and lower risk for short circuit.

10 Claims, 5 Drawing Sheets

(56) References Cited

U.S. PATENT DOCUMENTS

| | | | |
|---|---|---|---|
| 2008/0143944 A1* | 6/2008 | Chang | G02F 1/13458 |
| | | | 349/139 |
| 2008/0179593 A1* | 7/2008 | Lim | H01L 27/124 |
| | | | 257/59 |
| 2010/0155729 A1* | 6/2010 | Yang | H01L 27/124 |
| | | | 257/52 |
| 2011/0183479 A1 | 7/2011 | Lim et al. | |
| 2011/0273640 A1* | 11/2011 | Zhang | H01L 27/12 |
| | | | 349/43 |
| 2014/0211135 A1* | 7/2014 | Jung | G02F 1/136204 |
| | | | 349/106 |
| 2016/0063912 A1* | 3/2016 | Zhang | H01L 27/124 |
| | | | 345/212 |
| 2016/0255719 A1* | 9/2016 | Song | H05K 1/0296 |
| | | | 174/254 |
| 2017/0235199 A1* | 8/2017 | Wang | G02F 1/13306 |
| | | | 349/149 |
| 2019/0393247 A1* | 12/2019 | Huang | H01L 27/1255 |
| 2020/0027902 A1* | 1/2020 | Chien | H01L 27/3276 |

* cited by examiner

TFT ARRAY SUBSTRATE AND DISPLAY DEVICE

FIELD OF THE INVENTION

The present invention is generally related to the field of display technology, and more particularly to a thin film transistor (TFT) array substrate and a related display device.

BACKGROUND OF THE INVENTION

In the field of display technologies, flat panel display devices such as liquid crystal display (LCD) devices, due to their thin thickness, high quality, power saving, and low radiation, have gradually replaced cathode ray tube (CRT) display devices.

Existing LCD devices are usually back-lighted display devices, and include a LCD panel and a backlight module. The LCD panel usually include a color filter (CF) substrate, a thin film transistor (TFT) array substrate, and a liquid crystal layer and a sealant disposed between the two substrates. The principle behind a LCD panel is to alter the alignment of the liquid crystal molecules in the liquid crystal layer by the electrical field formed between the substrates. As such, light from the backlight module is refracted to produce pictures.

FIG. 1 is structural schematic diagram showing a conventional TFT array substrate. As illustrated, the TFT array substrate includes a substrate 100 and a metallic layer 200 disposed on the substrate 100. The TFT array substrate has an active area 110 and a fanout area 120. The metallic layer 200 includes multiple data lines 210 configured at intervals in parallel in the active area 110, and multiple fanout lines 220 configured in the fanout area 120, each connected to a data line 210. The fanout lines 220 connect the data lines 210 to an external integrated chip (IC) so that the IC may transmit data signals to the data lines 210. As shown in FIG. 1, each fanout line 220 includes a first straight segment 221, a slant segment 222, and a second straight segment 223, end-to-end sequentially connected. Each first straight segment 221 has an end connected to a corresponding data line 210, and the first straight segment 221 is extended along a same direction as the data line 210. The second straight segments 223 are configured at intervals in parallel, and are parallel to the data lines 210. The distance between two outermost data lines 210 is greater than the distance between the two outermost second straight segments 223. The slant segments 222 are of different lengths. Driven by the advancement of display technologies, the dimensions of LCD devices are getting larger. Correspondingly, for their TFT array substrate as shown in FIG. 1, the length difference between the slant segments 222 has also become more significant, causing greater variance to the impedances of the fanout lines 220. As data signals propagate to the data lines 210 through the fanout lines 220, they would arrive at different times due to the impedance differences, thereby affecting the display quality. To resolve this problem, as shown in FIG. 2, an existing solution is to add different numbers of detours 2211 along the first straight segments 221 so as to uniform the lengths and impedances of fanout lines 220 and to minimize the timing discrepancy between the data signals arriving at the data lines 210. However, limited by the current lithography technique, exposure anomaly often occurs around the detours 2211 when forming fanout lines 220 of FIG. 2, resulting in short circuit to the detours 2211. The impedances of the fanout lines 220 actually decrease and the input stability of data signals is difficult to guarantee.

SUMMARY OF THE INVENTION

An objective of the present invention is to provide a TFT array substrate that effectively reduces the impedance variation of the fanout lines corresponding to different data lines, and achieves stable input of data signals.

Another objective of the present invention is to provide a display device that effectively reduces the impedance variation of the fanout lines corresponding to different data lines, and achieves stable input of data signals.

To achieve the objectives, the present invention provides a TFT array substrate including a substrate, a first metallic layer disposed above the substrate, and a second metallic layer disposed above and insulated from the first metallic layer.

The second metallic layer includes a number of data lines at intervals in parallel and a number of first fanout lines, and the first metallic layer includes a number of second fanout lines. Each data line corresponds to a first fanout line and a second fanout line. The data line and its corresponding first fanout line are a distance apart.

The TFT array substrate has an active area and a fanout area to a lateral side of the active area. The data lines are disposed within the active area, each having a first end extending into the fanout area. The first and second fanout lines are all disposed within the fanout area. The first end of the data line has a vertical projection overlapped with and is electrically connected to a portion of a second fanout line corresponding to the first data line through a first via. A portion of the first fanout line has a vertical projection overlapped with and is electrically connected to a portion of the second fanout line through a second via.

The first metallic layer has a greater surface resistivity than that of the second metallic layer.

The first end of each data line that is extended into the fanout area is electrically connected to a second end of a corresponding second fanout line that is adjacent to the active area through the first via. A second end of each first fanout line that is adjacent to the active area is electrically connected to a first end of a corresponding second fanout line that is away from the active area through the second via.

The second fanout lines are extended along a same direction as their corresponding data lines.

The second fanout lines have an identical impedance.

The first metallic layer further includes a number of third fanout lines. Each data line corresponds to a third fanout line. The third fanout lines are disposed within the fanout area. A second fanout line and a third fanout line, both corresponding to a same data line, are a distance apart. A portion of the first fanout line has a vertical projection overlapped with and is electrically connected to a portion of third fanout line through a third via.

A first end of each first fanout line that is away from the active area is electrically connected to a second end of a corresponding third fanout line that is adjacent to the active area through the third via. A first end of each third fanout line that is away from the active area is extended to an edge of the substrate.

The third fanout lines are parallel to the data lines.

The third fanout lines have an identical impedance.

A distance between two outermost data lines is greater than a distance between two outermost third fanout lines.

The first metallic layer has a surface resistivity between 0.4Ω and 0.5Ω, and the second metallic layer has a surface resistivity between 0.05Ω and 0.15Ω.

The first metallic layer further includes a number of scan lines at intervals in parallel in the active area, and the scan lines are perpendicular to the data lines.

The TFT array substrate further includes an interlayer dielectric (ILD) layer disposed between the first and second metallic layers. The first, second, and third vias penetrate the ILD layer.

The present invention also teaches a display device, including the above described TFT array substrate.

The advantages of the present invention are as follows. The TFT array substrate disposes second fanout lines of the fanout area on a first metallic layer, and disposes first fanout lines of the fanout area on a second metallic layer. Data lines and their corresponding second fanout lines, and second fanout lines and their corresponding first fanout lines, are connected together through vias. The first metallic layer has a greater surface resistivity than that of the second metallic layer. The present invention's fanout lines corresponding to a same data line have a significantly increased total impedance, and the impedance variation of the fanout lines has a less impact. As data signals propagate to the data lines through the fanout lines, the data signals' arrival times to the data lines have little difference, thereby enhancing the display quality. In addition, the present invention has a more reliable manufacturing process and a lower risk for short circuit. The present invention also teaches a display device that effectively reduces the impedance variation of the fanout lines corresponding to different data lines, and achieves stable input of data signals.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
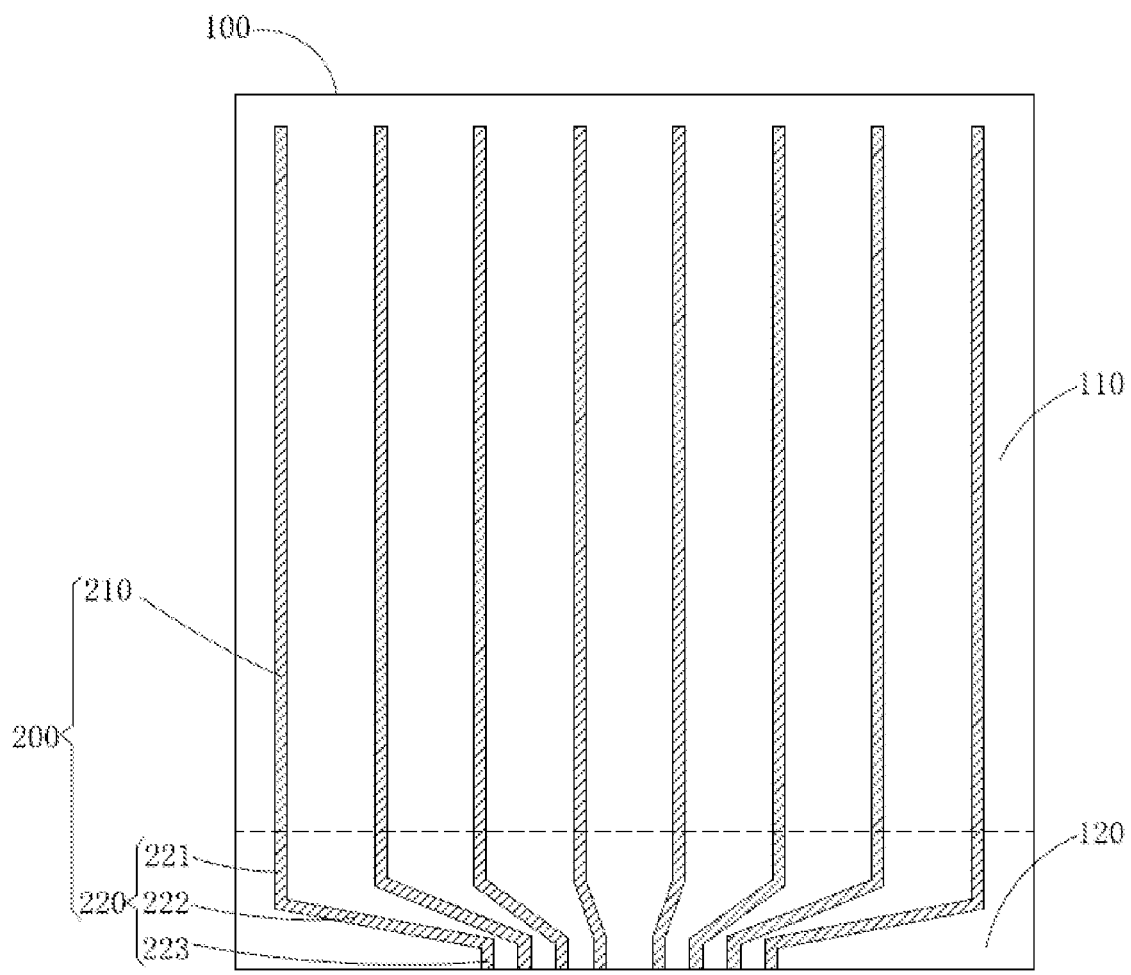
FIG. 1 is structural schematic diagram showing a conventional TFT array substrate.
Figure 2:
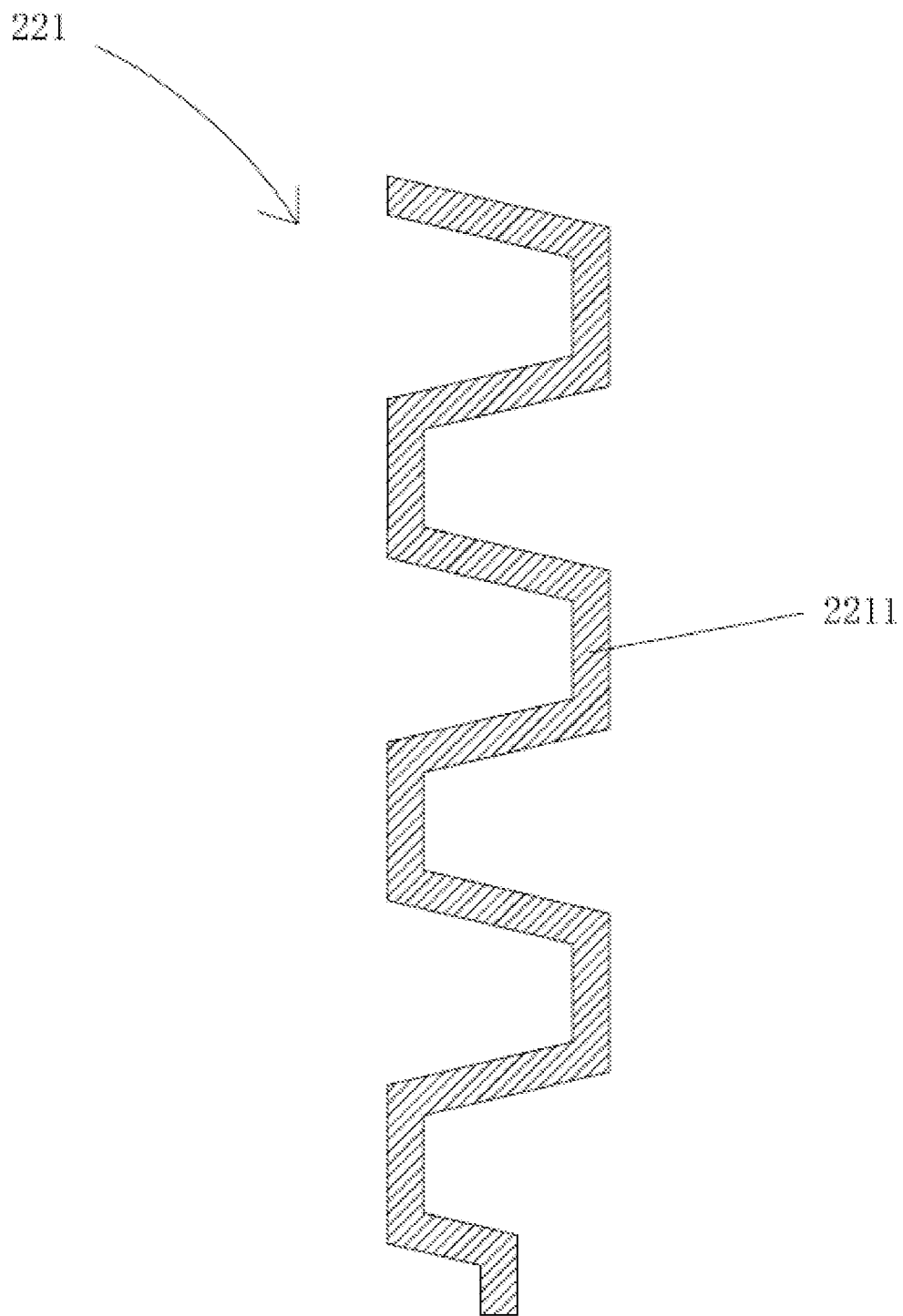
FIG. 2 is a schematic diagram showing an existing solution where detours are formed along the first straight segment of a fanout line.
Figure 3:
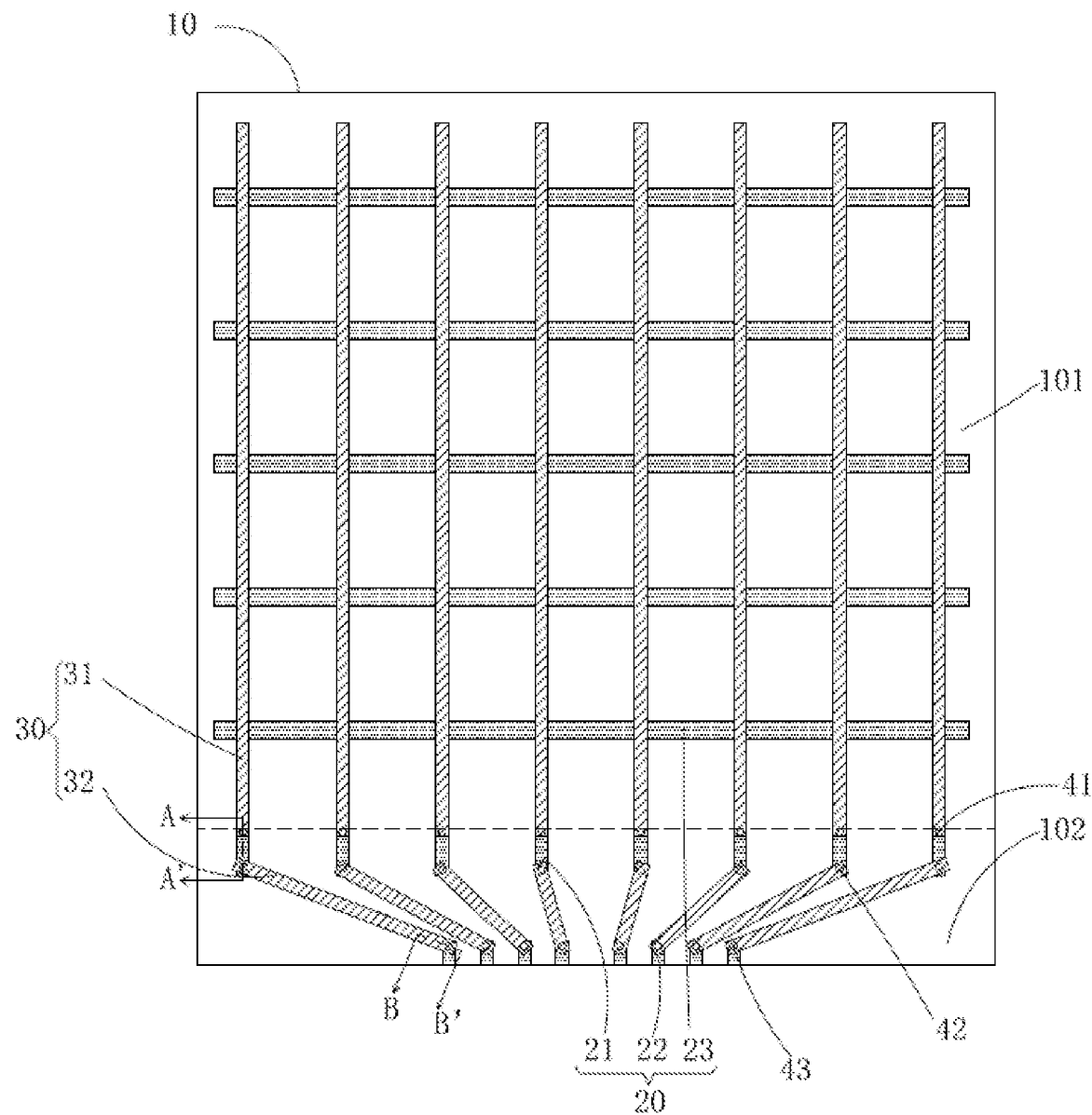
FIG. 3 is a structural schematic diagram showing a TFT array substrate according to an embodiment of the present invention.
Figure 4:
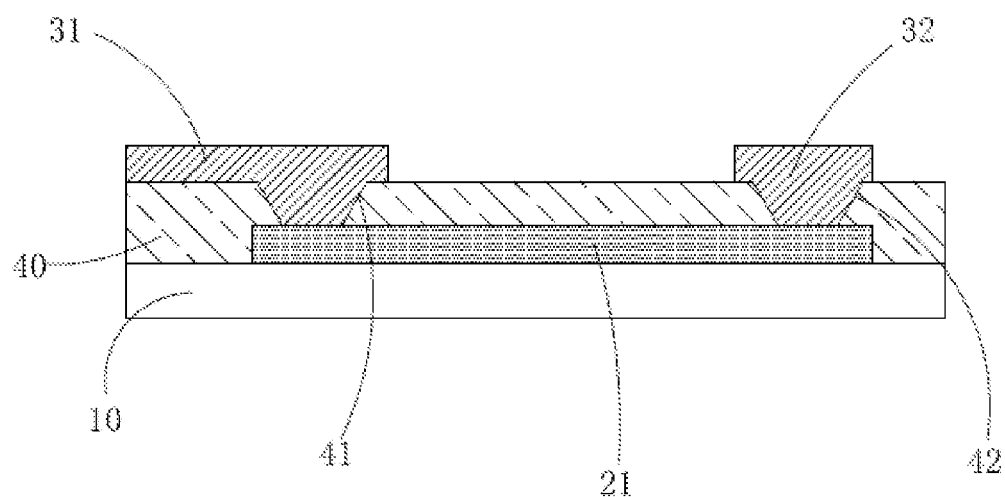
FIG. 4 is a sectional diagram showing the A-A section of FIG. 3.
Figure 5:
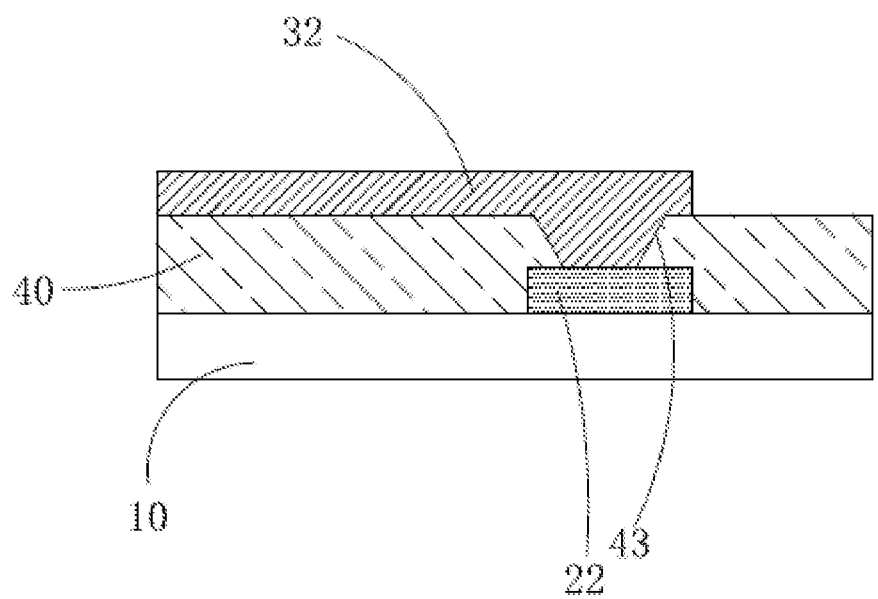
FIG. 5 is a sectional diagram showing the B-B section of FIG. 3.

As shown in FIGS. 3 to 5, a TFT array substrate according to an embodiment of the present invention a substrate 10, a first metallic layer 20 disposed on the substrate 10, an interlayer dielectric (ILD) layer 40 disposed on first metallic layer 20, and a second metallic layer 30 disposed on the ILD layer 40. Due to the ILD layer 40, the first and second metallic layers 20 and 30 are insulated from each other.

As shown in FIG. 3, the second metallic layer 30 includes multiple data lines 31 at intervals in parallel, and multiple first fanout lines 32. Each data line 31 corresponds to a first fanout line 32. The data line 31 and its corresponding first fanout line 32 are a distance apart. The first metallic layer 20 includes multiple second fanout lines 21 and multiple third fanout lines 22. Each data line 31 corresponds to a second fanout line 21 and a third fanout line 22. For a same data line 31, the corresponding second and third fanout lines 21 and 22 are a distance apart. The TFT array substrate includes an active area 101 and a fanout area 102 to a lateral side of the active area 101. The data lines 31 are disposed within the active area 101, but each having a first end extending into the fanout area 102. The first, second, and third fanout lines 32, 21, and 22 are all disposed within the fanout area 102.

Each data line 31 therefore has a corresponding first fanout line 31, a corresponding second fanout line 21, and a corresponding third fanout line 22. For these corresponding data line 31 and fanout lines 32, 21, and 22, as shown in FIGS. 3 and 4, the first end of the data line 31 has a vertical projection overlapped with a second end of the second fanout line 21. The data line 31's first end and the second fanout line 21's second end are electrically connected together through a first via 41 penetrating the ILD layer 40. A second end of first fanout line 32 has a vertical projection overlapped with a first end of the second fanout line 21. The first fanout line 32's second end and the second fanout line 21's first end are electrically connected together through a second via 42 penetrating the ILD layer 40. Each second fanout line 21 has a segment delimited by the first and second vias 41 and 42. These segments of the second fanout lines 21 have an identical impedance.

As shown in FIGS. 3 and 5, a first end of the first fanout line 32 has a vertical projection overlapped with a second end of the third fanout line 22. The first fanout line 32's first end and the third fanout line 22's second end are electrically connected together through a third via 43 penetrating the ILD layer 40.

It should be noted that the first metallic layer 20 has a greater surface resistivity than that of the second metallic layer 30.

Specifically, as shown in FIG. 3, the data line 31's first end that is extended into the fanout area 102 and the second fanout line 21's second end that is adjacent to the active area 101 are electrically connected together through the first via 41 penetrating the ILD layer 40. The first fanout line 32's second end that is adjacent to the active area 101 and the second fanout line 21's first end that is away from the active area 101 are electrically connected together through the second via 42 penetrating the ILD layer 40. The second fanout lines 21 and the data lines 31 are extended along a same direction.

Specifically, as shown in FIG. 3, the first fanout line 32's first end that is away from the active area 101 and the third fanout line 22's second end that is adjacent to the active area 101 are electrically connected together through the third via 43 penetrating the ILD layer 40. Furthermore, a first end of each third fanout line 22 that is away from the active area 101 is extended to an edge of the substrate 10.

Specifically, the second fanout lines 21 have an identical impedance, and the third fanout lines 22 have an identical impedance.

Preferably, as shown in FIG. 3, each second fanout line 21 is aligned with its corresponding data line 31. The third fanout lines 22 are parallel to the data lines 31. Two outermost data lines 31 have a distance in between greater than that between two outermost third fanout lines 22. For different data lines 31, their corresponding first fanout lines 21 may have different lengths.

Preferably, the first metallic layer 20 has a surface resistivity between 0.4Ω and 0.5Ω, and more preferably 0.45Ω. Preferably, the second metallic layer 30 has a surface resistivity between 0.05Ω and 0.15Ω, and more preferably 0.1Ω.

Specifically, as shown in FIG. 3, the first metallic layer 20 further includes multiple scan lines 23 at intervals in parallel in the active area 101. The scan lines 23 are perpendicular to the data lines 31.

It should be noted that the TFT array substrate of the present invention disposes the second and third fanout lines 21 and 22 of the fanout area 102 on the first metallic layer 20, and disposes the first fanout lines 32 of the fanout area 102 on the second metallic layer 30. A data line 31 is connected to a second fanout line 21 through a via, a second fanout line 21 is connected to a first fanout line 32 through another via, and the first fanout line 32 is connected to a third fanout line 22 through yet another via. By having appropriate materials for the first and second metallic layers 20 and 30, the first metallic layer 20 has a greater surface resistivity than that of the second metallic layer 30. Compared to the prior art where a fanout line is entirely disposed on a same layer as its corresponding data line, the present invention's first, second, and third fanout lines 32, 21, and 22 corresponding to a same data line 31 have a significantly increased total impedance, and the first fanout line 32's impedance accounts for a smaller portion of the total impedance due to its lower surface resistivity. Therefore the variation of the first fanout line 32's impedance has a less impact to the total impedance, even when the TFT array substrate has a greater dimension and the first fanout lines 32 have greater length differences. As data signals propagate to the data lines 31 through the fanout lines, the data signals' arrival times to the data lines 31 have little differences, thereby enhancing the display quality. In contrast to the prior art where detours are configured along the first straight segments to increase their lengths, the present invention has a more reliable manufacturing process and a lower risk for short circuit.

Following a same inventive idea, the present invention also teaches a display device including a TFT array substrate as described above. The details of the TFT array substrate is therefore omitted.

Specifically, the display device is a LCD device or other display device that requires a TFT array substrate as a driving mechanism.

It should be noted that the TFT array substrate of the present invention disposes the second and third fanout lines 21 and 22 of the fanout area 102 on the first metallic layer 20, and disposes the first fanout lines 32 of the fanout area 102 on the second metallic layer 30. A data line 31 is connected to a second fanout line 21 through a via, a second fanout line 21 is connected to a first fanout line 32 through another via, and the first fanout line 32 is connected to a third fanout line 22 through yet another via. By having appropriate materials for the first and second metallic layers 20 and 30, the first metallic layer 20 has a greater surface resistivity than that of the second metallic layer 30. Compared to the prior art where a fanout line is entirely disposed on a same layer as its corresponding data line, the present invention's first, second, and third fanout lines 32, 21, and 22 corresponding to a same data line 31 have a significantly increased total impedance, and the first fanout line 32's impedance accounts for a smaller portion of the total impedance due to its lower surface resistivity. Therefore the variation of the first fanout line 32's impedance has a less impact to the total impedance, even when the TFT array substrate has a greater dimension and the first fanout lines 32 have greater length differences. As data signals propagate to the data lines 31 through the fanout lines, the data signals' arrival times to the data lines 31 have little differences, thereby enhancing the display quality. In contrast to the prior art where detours are configured along the first straight segments to increase their lengths, the present invention has a more reliable manufacturing process and a lower risk for short circuit.

As described above, the TFT array substrate of the present invention disposes second and third fanout lines of the fanout area on a first metallic layer, and disposes first fanout lines of the fanout area on a second metallic layer. A data line is connected to a second fanout line through a via, a second fanout line is connected to a first fanout line through another via, and the first fanout line is connected to a third fanout line through yet another via. The first metallic layer has a greater surface resistivity than that of the second metallic layer. The present invention's first, second, and third fanout lines corresponding to a same data line have a significantly increased total impedance, and the impedance variation of the fanout lines has a less impact. As data signals propagate to the data lines through the fanout lines, the data signals' arrival times to the data lines have little differences, thereby enhancing the display quality. In addition, the present invention has a more reliable manufacturing process and a lower risk for short circuit. The display device of the present invention effectively reduces the impedance variation of the fanout lines corresponding to different data lines, and achieves stable input of data signals.

Above are embodiments of the present invention, which does not limit the scope of the present invention. Any equivalent amendments within the spirit and principles of the embodiment described above should be covered by the protected scope of the invention.

What is claimed is:
1. A thin film transistor (TFT) array substrate, comprising a substrate, a first metallic layer disposed above the substrate, and a second metallic layer disposed above and insulated from the first metallic layer, wherein
the second metallic layer comprises a plurality of data lines at intervals in parallel and a plurality of first fanout lines; the first metallic layer comprises a plurality of second fanout lines; each data line corresponds to a first fanout line and a second fanout line; the data line and its corresponding first fanout line are a distance apart;
the second fanout lines are straight lines extended along a same direction as their corresponding data lines; the second fanout lines have an identical impedance;
the TFT array substrate has an active area and a fanout area to a lateral side of the active area; the data lines are disposed within the active area, each having a first end extending into the fanout area; the first and second fanout lines are all disposed within the fanout area; the first end of the data line has a vertical projection overlapped with and is electrically connected to a portion of a second fanout line corresponding to the first data line through a first via; a portion of the first fanout line has a vertical projection overlapped with and is electrically connected to a portion of the second fanout line through a second via;

each second fanout line has a straight segment delimited by the first and second vias; these segments of the second fanout lines have an identical impedance;

the first metallic layer has a greater surface resistivity than that of the second metallic layer.

2. The TFT array substrate according to claim 1, wherein the first end of each data line that is extended into the fanout area is electrically connected to a second end of a corresponding second fanout line that is adjacent to the active area through the first via; and a first end of each second fanout line that is away from the active area is electrically connected to a second end of a corresponding first fanout line that is adjacent to the active area through the second via.

3. The TFT array substrate according to claim 1, wherein the first metallic layer further comprises a plurality of third fanout lines; each data line corresponds to a third fanout line; the third fanout lines are disposed within the fanout area; a second fanout line and a third fanout lines, both corresponding to a same data line, are a distance apart; a portion of the first fanout line has a vertical projection overlapped with and is electrically connected to a portion of third fanout line through a third via.

4. The TFT array substrate according to claim 3, wherein a first end of each first fanout line that is away from the active area is electrically connected to a second end of a corresponding third fanout line that is adjacent to the active area through the third via; and a first end of each third fanout line that is away from the active area is extended to an edge of the substrate.

5. The TFT array substrate according to claim 4, wherein the third fanout lines are parallel to the data lines, and have an identical impedance.

6. The TFT array substrate according to claim 5, wherein a distance between two outermost data lines is greater than a distance between two outermost third fanout lines.

7. The TFT array substrate according to claim 3, further comprising an interlayer dielectric (ILD) layer disposed between the first and second metallic layers, wherein the first, second, and third vias penetrate the ILD layer.

8. The TFT array substrate according to claim 1, wherein the first metallic layer has a surface resistivity between $0.4\Omega$ and $0.5\Omega$; and the second metallic layer has a surface resistivity between $0.05\Omega$ and $0.15\Omega$.

9. The TFT array substrate according to claim 1, wherein the first metallic layer further comprises a plurality of scan lines at intervals in parallel in the active area; and the scan lines are perpendicular to the data lines.

10. A display device, comprising a TFT array substrate as claimed in claim 1.

* * * * *